United States Patent
Brokaw et al.

[11] Patent Number: 5,982,201
[45] Date of Patent: Nov. 9, 1999

[54] LOW VOLTAGE CURRENT MIRROR AND CTAT CURRENT SOURCE AND METHOD

[75] Inventors: A. Paul Brokaw, Burlington, Mass.; Jonathan M. Audy, San Jose, Calif.

[73] Assignee: Analog Devices, Inc., Norwood, Mass.

[21] Appl. No.: 09/006,604

[22] Filed: Jan. 13, 1998

[51] Int. Cl.[6] .................................. H03F 3/45; G05F 1/10
[52] U.S. Cl. ........................... 327/53; 327/541; 327/538; 323/312; 323/313
[58] Field of Search .................................. 327/53, 65, 66, 327/538, 540, 541, 543, 512, 513, 378; 323/312, 313, 315; 330/288

[56] References Cited

U.S. PATENT DOCUMENTS

| | | | |
|---|---|---|---|
| 4,680,483 | 7/1987 | Giordance | 327/66 |
| 5,200,654 | 4/1993 | Archer | 327/66 |
| 5,349,285 | 9/1994 | Okanobu | 323/12 |
| 5,485,074 | 1/1996 | Tomasini et al. | 323/315 |
| 5,828,329 | 10/1998 | Burns | 341/155 |

*Primary Examiner*—Timothy P. Callahan
*Assistant Examiner*—An T. Luu
*Attorney, Agent, or Firm*—Koppel & Jacobs

[57] ABSTRACT

A low voltage CTAT current source includes a bipolar transistor connected across two series-connected resistors. A voltage developed across the resistors turns on the transistor, making the current through the resistors CTAT. A second transistor supplies the resistor current; its base (if bipolar) is connected to the node between the resistors, which are selected to limit the transistor's base-collector forward bias and collector-emitter voltage to a preselected fraction of the first transistor's $V_{be}$, allowing the CTAT current source to operate with supply voltages of less than two junction voltage drops. A PTAT current can be combined with the CTAT current to create a temperature-compensated current. A low voltage current mirror has the respective bases of a pair of cascoded transistors connected across a resistor which is also connected between the bottom transistor's collector and a programming current. When the transistors are matched, the top transistor's collector-emitter voltage about equals the voltage across the resistor, which is selected to establish a $V_{ce}$ just high enough to avoid saturation and allow the circuit to operate with only two unsaturating $V_{ce}$'s of headroom. The current mirror's lower headroom requirements are advantageously employed in a low voltage differential to single-ended converter circuit, and the current mirror and CTAT current source can be combined in numerous analog circuits to enable their operation at lower supply voltages.

20 Claims, 6 Drawing Sheets

LOW VOLTAGE CURRENT MIRROR AND CTAT CURRENT SOURCE AND METHOD

BACKGROUND OF THE INVENTION

1. Field of the Invention

This invention relates to the field of current source and mirror circuits, particularly those designed for use with low supply voltages.

2. Description of the Related Art

Integrated circuit components continue to shrink in size, and demands on circuit efficiency, particularly in battery-powered devices, continue to increase. One way to accommodate these trends is to lower a circuit's supply voltage, which reduces the amount of heat which must be dissipated as well as the drain on the battery.

However, as supply voltages fall, some commonly used analog circuit building blocks no longer function as designed. One such circuit is shown in the schematic diagram of FIG. 1, which is designed to generate a complementary-to-absolute temperature (CTAT) current from a poorly controlled source of current $i_{poor}$. A "poorly controlled" source of current is characterized as a current whose precise magnitude is unpredictable. Such a current may arise, for example, in a voltage regulator circuit at start up. The poorly controlled current $i_{poor}$ is connected to the collector of a pnp transistor QA and the base of a pnp transistor QB whose emitter is connected to the base of QA. QA's emitter is connected to a supply voltage V+ and the collector of QB serves as the output 10 of the current source. A resistor R is connected across the base and emitter of QA.

In operation, the base of QB is pulled low by $i_{poor}$ until QA is turned on and supplies $i_{poor}$. When turned on, QA's base-emitter voltage $V_{beA}$ is across R. Since $V_{beA}$ responds only weakly to $i_{poor}$ but strongly to temperature, the current through R and passed by QB to the output 10 is nominally CTAT.

The voltage drop from the emitter of QA to the base of QB is equal to the base-emitter drop of QA plus that of QB ($V_{beA}+V_{beB}$), which may equal 1.6 volts or more, particularly at cold temperatures. This works well with a V+ of 3 volts or more, but will not operate with a supply voltage of 1.5 volts or less, as modern-day circuits increasingly demand. Moreover, the output terminal cannot approach the rail voltage (V+) any closer than $V_{satB}$ (QB's saturation voltage)+$V_{beA}$.

Current mirror designs are also challenged by the use of lower supply voltages. A Wilson mirror is widely used where performance superior to a simple current mirror is needed, and is shown in FIG. 2. Here, a programming current $i_{pgm}$ is sourced by a transistor QC, which is mirrored by a diode-connected transistor QD connected to have the same base-emitter voltage as QC. A cascode transistor QE is inserted between QD and the load to pin the collector of QC at two junction voltage drops below V+ and thus reduce voltage variations across QC. Use of this circuit, however, requires that V+ be equal to at least 2 junction voltage drops, or two gate voltages for an FET implementation, in series.

The differential amplifier is another analog circuit building block, an example of which is shown in the schematic diagram of FIG. 3. Transistors QF and QG form a differential amplifier, biased with a current source $i_{diff}$ connected to their respective emitters. A differential input voltage $V_{in}$ is applied across QF's and QG's respective bases and a differential output current appears at their respective collectors. The collectors of two current mirror transistors QH and QJ are connected to the collectors of QF and QG, respectively, to provide a differential to single-ended converter for the differential output current, with a single-ended output taken from QJ's collector. The differential amplifier and its tail current source typically consume about one volt of headroom at low temperatures, with another 0.6–0.9 volts lost due to the base-emitter voltages of converter transistors QH and QJ. Thus, this conventional differential amplifier and converter is also rendered unusable at supply voltages below about 1.6 volts.

SUMMARY OF THE INVENTION

A current mirror and CTAT current source circuit are presented which are functional in circuits having supply voltages as low as about 1.5 volts, overcoming the limitations found in the prior art circuits noted above.

A CTAT current source is described which uses a poorly controlled current to create a well-defined CTAT current, but which in a preferred embodiment requires less headroom than prior art circuits. The poorly controlled current is drawn through a resistance circuit which has a bipolar transistor connected across it. Current through the resistance circuit develops a voltage which turns the transistor on, establishing a CTAT current through the resistance circuit. A second, "supply" transistor is connected to supply current through the resistance, with the voltage across the resistance circuit used to bias it to operate in its active region. An output circuit, preferably a third transistor connected to mirror the current through the supply transistor, produces a CTAT output current.

The resistance circuit is preferably made from two resistors connected in series. The supply transistor's control input is connected to the junction between the resistors, and its current circuit is connected between a supply voltage and the resistors. The base and emitter of the bipolar transistor are connected across the two resistors, which are chosen so that the voltage across them induced by the poorly controlled current is sufficient to make the bipolar transistor active. Headroom gains are achieved by properly selecting the resistor values to set the supply transistor's base-collector forward bias (if bipolar), and its collector-emitter voltage, to preselected fractions of the bipolar transistor's $V_{be}$. Establishing the supply transistor's $V_{ce}$ just above saturation allows it to operate in its active region, and the current source to operate properly without using up two full junction voltage drops. A cascode transistor can be connected in series with the current circuit of the transistor mirroring the supply transistor to increase the impedance of the current output.

A circuit which provides the performance of a Wilson mirror, but which is functional at lower supply voltages is also described. This low voltage current mirror has a top and bottom transistor arranged in a cascode configuration between a supply voltage and a resistor, with the transistors' respective bases connected across the resistor. The transistors supply current through the resistor, and the voltage across the resistor is used to bias the top transistor to operate in its active region. An output circuit, preferably a like pair of cascoded transistors, mirrors the current through the top and bottom transistor to produce an output current.

The low voltage current mirror preferably includes a programming current source connected to supply current to the resistor. When the programming current is applied, the top and bottom transistors begin to conduct, with the base voltage of the top transistor being more positive than that of the bottom transistor by the voltage across the resistor. If the transistors are matched, the top transistor's collector-emitter voltage will be about equal to the resistor voltage. The resistor and programming current are selected to establish a $V_{ce}$ for the top transistor that is just high enough to avoid saturation. The current mirror circuit requires only two unsaturating $V_{ce}$'s to operate, in contrast with the prior art's two junction drop requirement.

The novel current mirror is employed as a differential to single-ended converter for a differential amplifier, which also requires less headroom than previous designs. The collectors of a differential amplifier's input stage are connected to the respective emitters of the current mirror's bottom pair of transistors. A single-ended current output proportional to a differential voltage applied to the input stage appears at the current mirror's output. The headroom gains provided by the new current mirror permit the differential amplifier to operate with higher differential input voltages than was possible with conventional designs, with lower supply voltages, or even with inputs referenced to the supply voltage.

The CTAT current source and current mirror can be used together in numerous circuits in which a low supply voltage requirement is imposed. For example, the output of the CTAT current source can be combined with a proportional-to-absolute-temperature (PTAT) current to create a temperature-compensated current which could be used to bias a number of circuits, including the low voltage differential to single-ended converter described above. Thus, the low voltage building block circuits described herein enable the operation of high performance analog circuitry at heretofore unusable supply voltages.

Further features and advantages of the invention will be apparent to those skilled in the art from the following detailed description, taken together with the accompanying drawings.

DETAILED DESCRIPTION OF THE INVENTION

Figure 4:
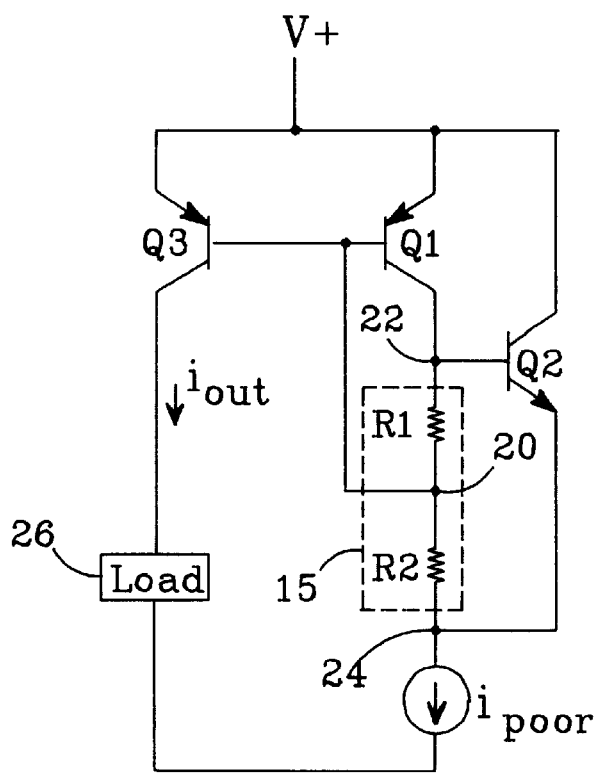
FIG. 4 is a schematic diagram of a low voltage CTAT current source per the present invention.

A schematic diagram of a CTAT current source capable of operating at lower supply voltages than did prior art circuits is shown in FIG. 4. A resistance circuit 15 preferably includes a pair of resistors R1 and R2 connected in series and joined at a common node 20. A transistor Q1, shown here as a pnp bipolar transistor (though other transistor types may also be used, as discussed below), has its emitter connected to a supply voltage V+, its collector connected to the terminal of R1 opposite common node 20 forming a node 22, and its base connected to node 20. A bipolar transistor Q2, shown here as an npn (though a pnp may also be used, as discussed below), has its base connected to node 22 and its emitter connected to the terminal of R2 opposite common node 20 forming node 24. A transistor Q3, shown here as a pnp bipolar transistor, has its base and emitter connected in common with those of Q1, so that Q3 mirrors the current through Q1. The output $i_{out}$ of the CTAT current source is taken at the collector of Q3, to which a load 26 can be connected.

A poorly controlled current source $i_{poor}$, defined above, is connected at node 24. Though $i_{poor}$ need not be a constant current, it must have a reliable minimum value $i_{poor}(\text{min.})$. R1 and R2 are selected to insure that when $i_{poor}(\text{min.})$ flows through them, the voltage developed across R1 and R2 is sufficient to turn bipolar transistor Q2 on.

In operation, $i_{poor}$ is applied at node 24, pulling the base of Q1 low until Q1 turns on and supplies $i_{poor}$ through R1 and R2. This causes Q2 to turn on, so that its base-emitter voltage $V_{be2}$ is imposed across the resistors. Current through Q1 increases until it supplies the current required by R1+R2 biased by $V_{be2}$, plus the base current of Q2. Because the voltage across R1 and R2 is $V_{be2}$, the current through the resistors is predominately CTAT. Further increases in $i_{poor}$, i.e., "excess" current beyond that needed to turn on Q2, is carried off by Q2, so that the resistor current remains CTAT despite variations in $i_{poor}$ as long as $i_{poor}$ is at least equal to $i_{poor}(\text{min.})$. Q1 and Q3 have their base and emitter connections in common, so that the collector current of Q3, i.e., $i_{out}$, will about equal the CTAT collector current of Q1. Output current $i_{out}$ is thus itself a CTAT current.

CTAT output current $i_{out}$ is derived from having $V_{be2}$ across R1 and R2. As long as $i_{poor}$ is equal to or exceeds $i_{poor}(\text{min.})$, $V_{be2}$ will vary only slightly with variations in $i_{poor}$. Thus, in addition to being CTAT, output current $i_{out}$ is likely to be much more constant than $i_{poor}$.

The compliance of the current source is maximized by minimizing Q3's collector-emitter voltage, which, because of Q1's and Q3's common base and emitter connections, mirrors the $V_{ce}$ of Q1. However, though a low $V_{ce1}$ is desirable, it should not be made so low as to drive Q1 into saturation—Q1 must be kept in its active region so that it can respond to changes in $i_{poor}$. If Q2's entire base-emitter voltage were allowed to develop across Q1, its base-collector junction would become forward-biased and Q1 driven into hard voltage saturation. This is prevented by splitting the resistance between Q2's base and emitter into two resistors R1 and R2, and connecting Q1's base to the node 20 between them. By properly selecting the values of R1 and R2, the forward bias of Q1's base-collector junction, and Q1's collector-emitter voltage, are limited to a preselected fraction of $V_{be2}$, selected to operate Q1 close to, but safely out of, its saturation region.

In designing a CTAT current source per the present invention, Q2's characteristics are first checked to determine what $V_{be2}$ will be at a desired operating temperature for an expected range of excess current. An R1+R2 value is then chosen so that a voltage at least equal to $V_{be2}$ is developed across the resistors with $i_{poor}(\text{min.})$ flowing through them.

$V_{ce1}$ is equal to $V_{be1}+V_{R2}-V_{be2}$. If Q1 and Q2 have about equal $V_{be}$ values, $V_{ce1}$ will be about equal to $V_{R2}$, i.e., the voltage across R2. Maximum compliance is achieved by choosing a value for R2 that provides a $V_{R2}$ at $i_{poor}$(min.) that sets $V_{ce1}$ at the lowest possible voltage at which Q1 is active and capable of delivering $i_{poor}$(min.) plus the base current of Q2; that minimum voltage is referred to herein as $V_{ce1}$(min.). Though the voltage across R2 does reduce the headroom for the poorly controlled current source, a judicious trade-off between R1 and R2 allows Q1 to operate properly without using up two full junction voltage drops.

Figure 1:
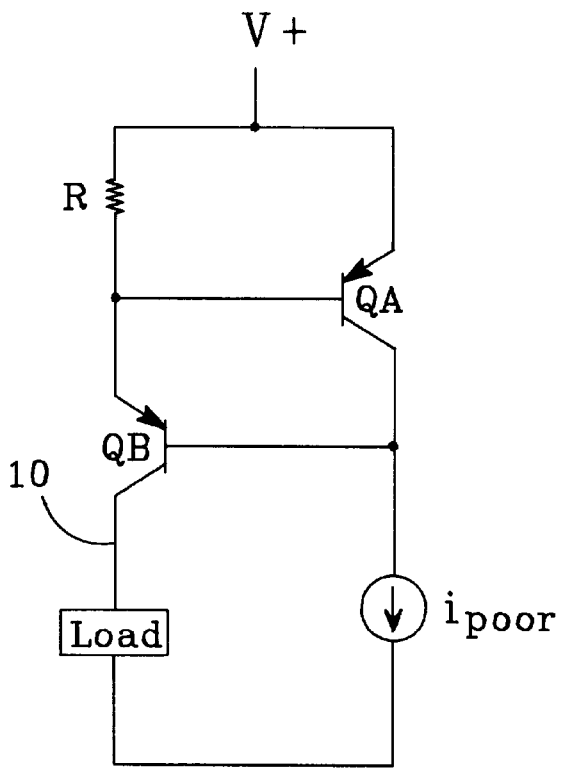
FIG. 1 is a schematic diagram of a prior-art CTAT current source.
Figure 2:
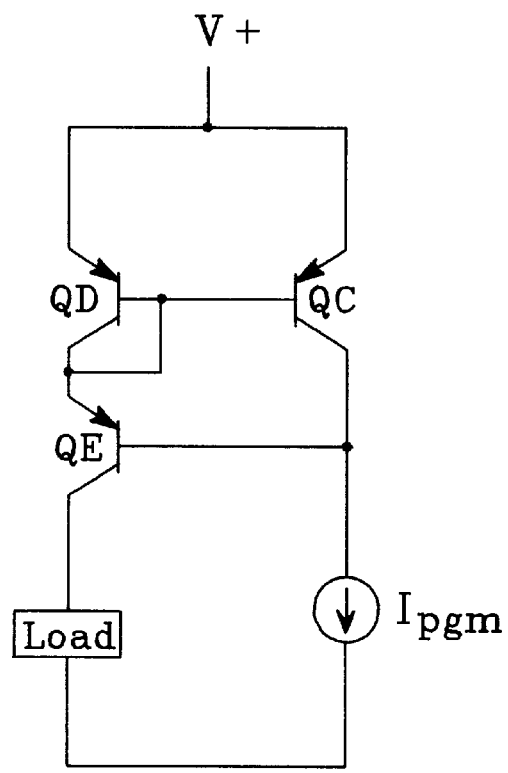
FIG. 2 is a schematic diagram of a prior-art current mirror.
Figure 3:
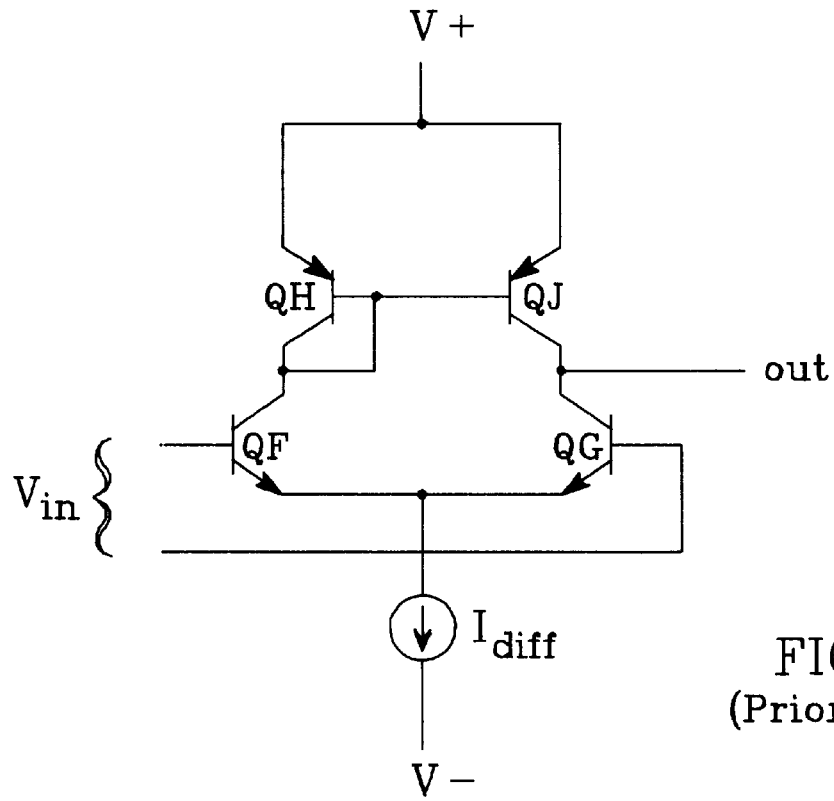
FIG. 3 is a schematic diagram of a prior-art differential amplifier and differential to single-ended converter.

As an example: $i_{poor}$(min.)=10 μa, and $V_{be2}$=900 mv when Q2 is at its operating temperature and carrying the maximum expected excess current. R1+R2 are thus made equal to 900 mv/10 μa=90 kΩ. Q1 is known to operate in its active region with a $V_{ce1}$ of at least 200 mv; i.e., $V_{ce1}$(min.)= 200 mv. R1 is thus made equal to 70 kΩ and R2 made equal to 20 kΩ, so that $V_{R2}$=10 μa×20 kΩ=200 mv, which equals $V_{ce1}$ when Q1 and Q2 have equal $V_{be}$'s. This makes the voltage at node 24 equal to V+−$V_{ce1}$−900 mv=V+−1.1 volts. If supply voltage V+ is equal to 1.5 volts, there are 400 mv of headroom left at node 24. The prior art circuit of FIG. 1, with its requirement of two junction drops to operate, would typically consume the entire 1.5 volt supply voltage.

The output current $i_{out}$ of the CTAT current source can be made greater or lesser than the current through Q1 by fabricating the emitters of Q1 and Q3 with unequal areas, with the ratio of their respective collector currents equal to the ratio of their emitter areas.

Figure 5A:
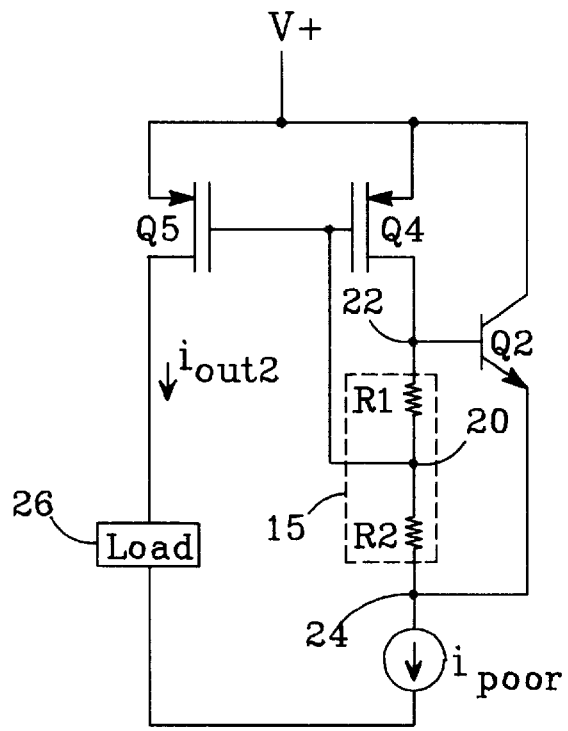
FIG. 5a is a schematic diagram of an alternative embodiment of a low voltage CTAT current source per the present invention using FET transistors.

An implementation of the present low voltage CTAT current source using FETs is shown in the schematic diagram of FIG. 5a. Transistors Q4 and Q5, shown here as p-channel FETs, are substituted for pnp transistors Q1 and Q2 in the circuit of FIG. 4. The respective sources of Q4 and Q5 are connected to supply voltage V+, and their gates are connected together and to the node 20 between R1 and R2. Operation of the circuit is the same as for the bipolar implementation of FIG. 4: current $i_{poor}$ through resistors R1 and R2 turns bipolar transistor Q1 on, making the current through the resistors CTAT. FET Q4 supplies the CTAT current through the resistors. Since Q4 and Q5 have their source and gate connections in common, the drain current of Q5 is about equal to the drain current of Q4. Because Q4's drain current is predominantly the CTAT current in R1 and R2, the drain current of Q5, i.e., $i_{out2}$, will be CTAT as well.

FET Q4 should be operated in its current saturation region so that it can respond to changes in $i_{poor}$, with Q4's gate voltage set so that it produces a drain current equal to $i_{poor}$(min.) plus the base current of Q2. When Q4 and Q5 are matched, the drain of Q5 will comply with voltage swings to within about $V_{gs4}-V_{t4}$ of supply voltage V+, i.e., that $V_{gs4}-V_{t4}$ which puts Q4 safely into current saturation for a given value of $i_{poor}$(min.). The emitter voltage of Q2 need be no more negative than $V_{gs4}-V_{t4}$ plus $V_{be2}$, but in practice should be made slightly larger to allow for variability in the device parameters.

The output current $i_{out2}$ of the CTAT current source can be made greater or lesser than the current through Q4 by fabricating the drains of Q4 and Q5 with unequal areas, with the ratio of their respective drain currents equal to the ratio of their drain areas.

A CTAT current source which sinks rather than sources a CTAT current is obtained by inverting the polarity of transistors Q2, Q4 and Q5 and supply voltage V+, or of transistors Q1–Q3 and V+ for the circuit of FIG. 4.

Figure 5B:
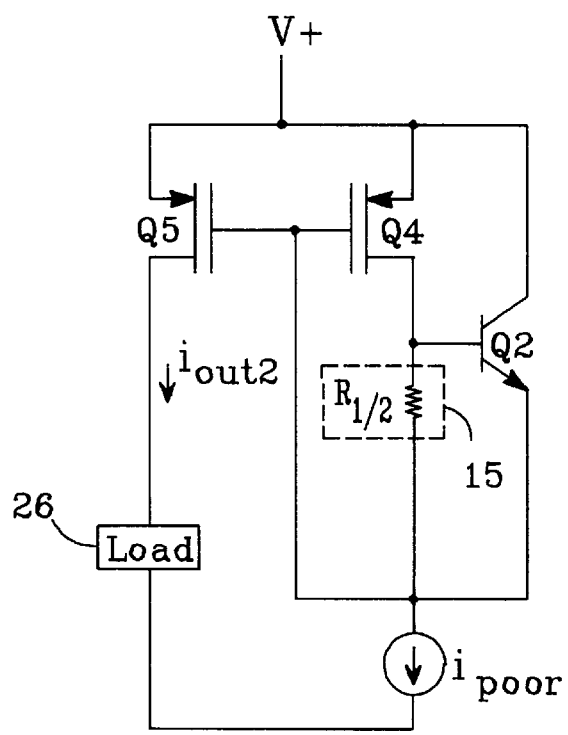
FIG. 5b is a schematic diagram of an alternative embodiment of a low voltage CTAT current source using a single resistor.

In some instances, a useful current source can be made with a resistance circuit comprising only one resistor, instead of the split resistors of FIG. 5a. This is illustrated in the schematic diagram of FIG. 5b, for which resistance circuit 15 consists of a single resistor $R_{1/2}$ connected between the base and emitter of Q2, with the gate of Q4 connected to the current source side of $R_{1/2}$. This configuration is functional as long as Q4's $V_t$ is reliably greater than Q2's $V_{be}$, so that Q4 operates in its current saturation region even with all of $V_{be2}$ between its gate and drain; when this condition is met, the circuit in FIG. 5b provides even greater headroom improvements than does that of FIG. 5a. Note that this configuration would not be functional if Q4 were bipolar, because imposing the entire $V_{be2}$ across the base and collector of a bipolar Q4 would force it into hard voltage saturation.

Figure 6:
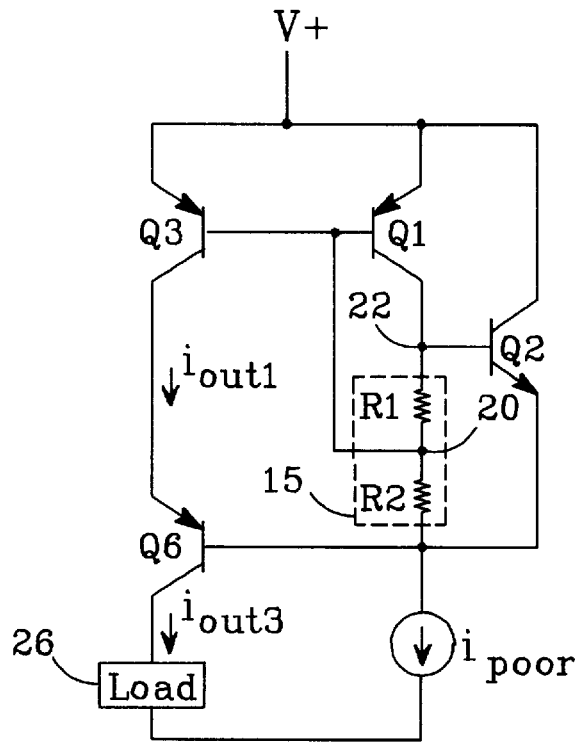
FIG. 6 is a schematic diagram of a low voltage CTAT current source per the present invention, illustrating the use of an output impedance-raising cascode transistor.

A modification of the circuit of FIG. 4 is shown in the schematic diagram in FIG. 6. In FIG. 4, transistors Q1 and Q3 form a simple current mirror, with Q3 producing a current output $i_{out1}$ that is satisfactory for many applications. However, for applications which involve large changes in the supply and/or load voltages, the impedance of the current output is raised by using a cascode transistor Q6. The emitter of Q6 (shown here as a pnp transistor, though an npn or FET might be appropriate in the alternative embodiments discussed above) is connected to receive $i_{out1}$, its base is connected to the emitter of Q2, and the output $i_{out3}$ of the current source is now taken at Q6's collector. Q2 and Q6 are preferably manufactured to have similar base-emitter voltages, so that the emitter of Q6 is at approximately the same voltage as the base of Q2. As a result, the collector voltages of Q1 and Q3 are nearly equal, independent of the load voltage at the collector of Q6. This stabilizes the output current against changes in supply and load voltage.

The output of the CTAT current source could be combined with a source of proportional-to-absolute-temperature (PTAT) current to create a temperature compensated current; this is discussed in detail below in connection with FIG. 9.

The current mirror is another basic analog circuit block that is called upon to operate in circuits running at low supply voltages, with the Wilson mirror typically employed where performance superior to that of a simple current mirror is needed. However, as discussed above, a Wilson mirror requires an operating voltage of at least two bipolar junction drops or two gate voltages.

Figure 7:
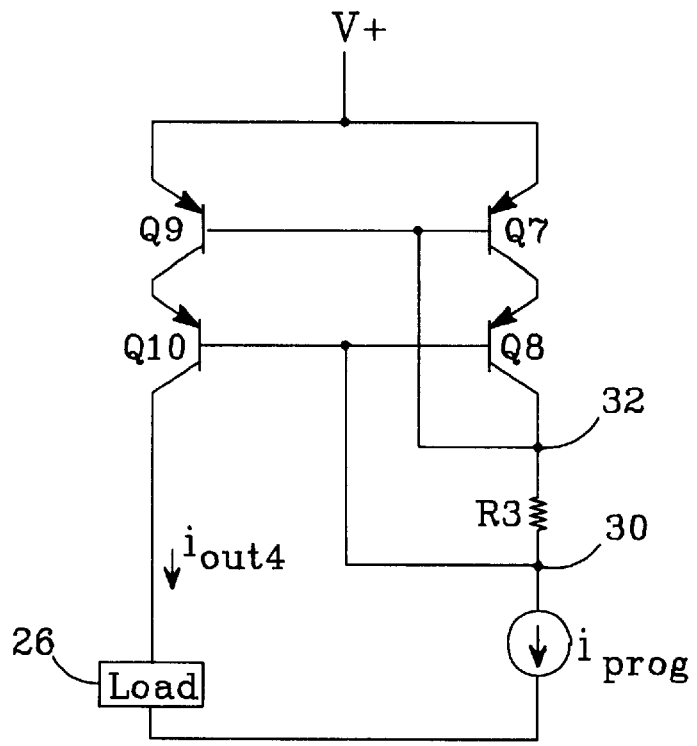
FIG. 7 is a schematic diagram of a low voltage current mirror per the present invention.

A current mirror circuit is shown in the schematic diagram in FIG. 7 which provides the superior performance of a Wilson mirror, but which can function at a lower operating voltage. A programming current source $i_{prog}$ is connected to one terminal 30 of a resistor R3. A first pair of transistors Q7 and Q8 are connected in a cascode configuration, with Q7's collector connected to Q8's emitter; Q7's emitter is connected to a supply voltage V+ and Q8's collector is connected to the other terminal 32 of R3. The bases of Q7 and Q8 are connected across R3, to terminals 32 and 30, respectively. A second pair of cascoded transistors Q9 and Q10 are parallel to the first pair, with the bases of Q9 and Q10 connected to the bases of Q7 and Q8, respectively, so that, when Q7–Q10 are matched, current through Q7 and Q8 is mirrored by Q9 and Q10. The output $i_{out4}$ of the current mirror is taken at the collector of Q10.

In operation, $i_{prog}$ pulls the base of Q8 low, and through resistor R3 also pulls the base of Q7 low. As Q7 and Q8 start to conduct, $i_{prog}$ will flow in R3, with the exception of the relatively small base currents of Q8 and Q10. As a result, the base voltage of Q7 will be more positive than the base voltage of Q8 by about $V_{R3}$ (i.e., the voltage across R3=$i_{prog}$×R3). If Q7 and Q8 are matched devices, with approximately equal values of $V_{be}$, Q8's emitter voltage will be less than Q7's emitter voltage by about $V_{R3}$. Note that a slightly different voltage can be set up by using intentionally mismatched devices for Q7 and Q8.

The voltage between Q7's emitter and Q8's emitter is Q7's collector-emitter voltage ($V_{ce7}$), which is established by the values chosen for $i_{prog}$ and R3. Again assuming matched transistors, the collector voltages of Q9 and Q7 will be nearly equal, and $V_{ce7}=V_{ce9}$. Thus, the compliance of the current source, equal to the minimum possible voltage between Q10's collector and V+, is about equal to $V_{ce9}+V_{ce10}$. R3 and $i_{prog}$ are chosen to establish a $V_{ce7}$ sufficient to operate Q7 in its active region, with maximum compliance achieved when $V_{ce7}$ is set to the minimum voltage at which Q7 will operate—typically about 200 mv for a bipolar transistor. With a $V_{ce9}$ and $V_{ce10}$ of about 200 mv at room temperature, $i_{out4}$ can comply to within about 400 mv of V+—considerably lower than the two junction drops required by the Wilson mirror. Headroom improvement will be gained as long as $V_{ce9}$ is less than Q9's "turn-on" voltage, which for a bipolar transistor is equal to its junction voltage.

Q9 dominates control of $i_{out4}$, so that changes in output voltage have only a small effect on output current. $V_{be10}$ is modulated by the output voltage, but this effect is small and the apparent output impedance is high.

By fabricating the emitters of Q9 and Q7 with different areas, mirroring ratios other than one can be established. This will only weakly affect the voltages present on the transistors, however, so that the mirror's high output impedance will be preserved.

The low voltage current source can also be implemented with npn bipolar transistors, or with n or p channel FETs, by appropriately inverting the polarities of the supply voltage and programming current. For a FET implementation, headroom improvement is gained as long as the voltage across the FET in Q9's position is less than its "turn-on" voltage, which for an FET is equal to its gate threshold voltage.

Figure 8:
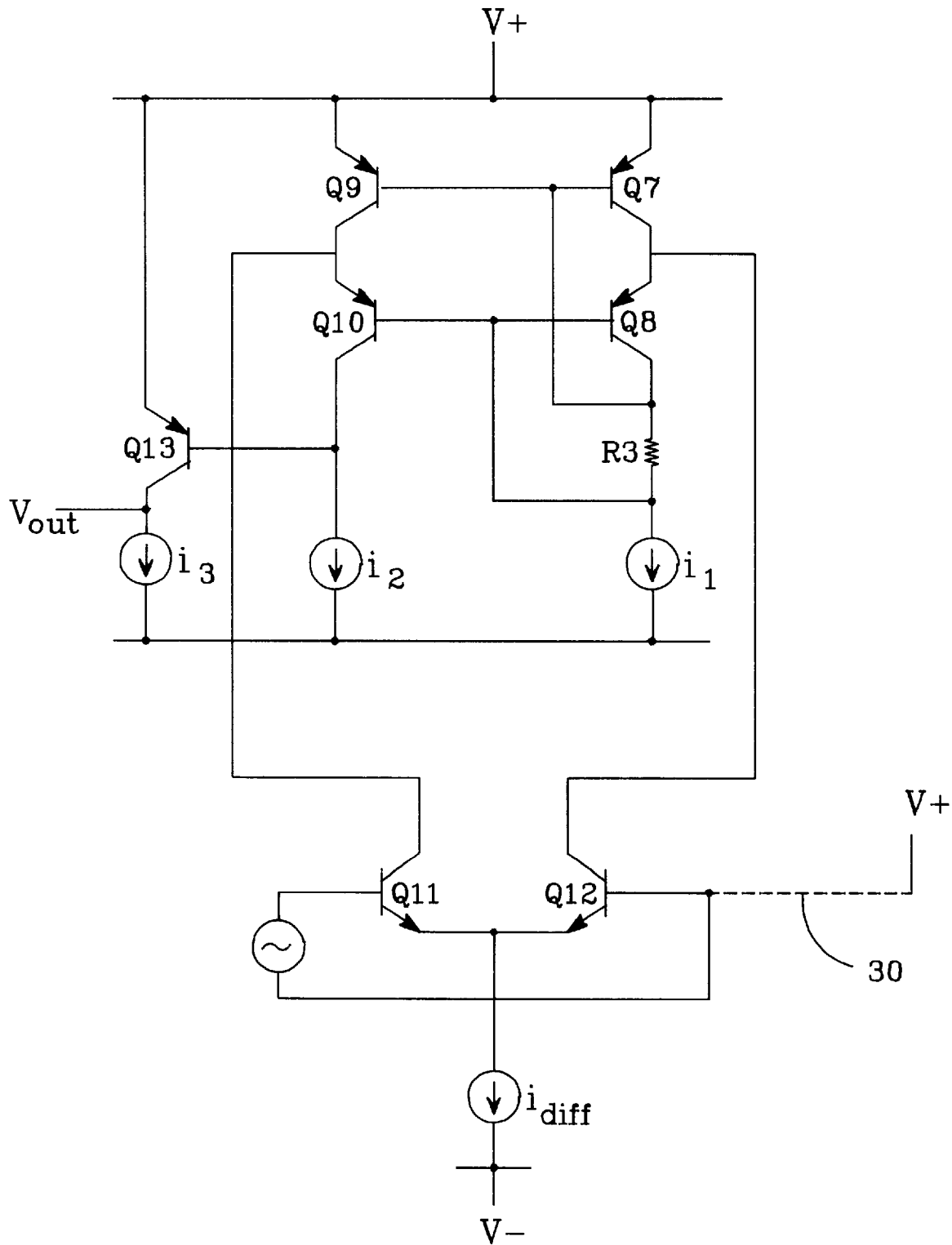
FIG. 8 is a schematic diagram of a differential amplifier which employs a current mirror per the present invention as a low voltage differential to single-ended converter.

The low voltage current mirror is beneficially employed as a converter for a differential amplifier, converting the amplifier's differential current output to a single-ended current, as shown in the schematic diagram of FIG. 8. A differential amplifier input stage is formed by transistors Q11 and Q12, biased by a current source $i_{diff}$ connected to their respective emitters. A differential voltage $V_{in}$ is applied across the pair's respective bases, and a differential current proportional to $V_{in}$ appears at Q11's and Q12's respective collectors. Though shown as npn bipolar transistors, the invention also contemplates differential input stages made from pnps and FETs.

The low voltage current mirror of FIG. 7 serves as a differential to single-ended converter for the input stage, with the collector of Q11 connected to the emitter of Q10, and the collector of Q12 connected to the emitter of Q8. A bias current source $i_1$ takes the place of FIG. 7's "$i_{prog}$", connected in series with R3. A single-ended current output is taken from Q10's collector, biased with a current source $i_2$. The single-ended current output is connected to the base of a transistor Q13 which serves as the amplifier's voltage gain stage, with the amplifier's output OUT taken at Q13's collector, which is biased with a current source $i_3$.

As noted above in connection with FIG. 7, the emitter voltages of Q8 and Q10 are approximately equal when Q7–Q10 are matched. Biases $i_1$ and $i_2$ are preferably made about equal so that the current mirror is balanced. Differences in the collector currents of Q11 and Q12 disturb the balance and produce some output at Q10's collector, which is amplified by Q13. Bias $i_3$ establishes Q13's zero-signal operating point, and modulating its collector current results in large voltage swings at its collector.

The base currents required to bias both Q8 and Q10 at approximately $i_1$, and the base currents to bias Q7 and Q9 at approximately $i_1$ plus ½ of $i_{diff}$, are all supplied by bias current source $i_1$. Thus, the actual current mirrored to Q10 is equal to $i_1$—(the base currents of Q7–Q10 operating at $i_1$+the base currents of Q11–Q12 operating at $i_{diff}/2$). Thus, to balance the current mirror as described above, bias current source $i_2$ should be less than $i_1$ by the parenthetical quantity above. Bias current source $i_3$ is then preferably equal to $(4 \times i_1) + i_{diff}$, so that what remains of bias $i_2$ after driving Q13's base will be just enough to balance the current actually coming out of Q10.

As noted above, the low voltage current mirror is preferably arranged to create a $V_{ce}$ for Q7 and Q9 of about 200 mv. Thus, the headroom consumed by the converter is no longer a full junction drop as in the prior art, but is now reduced to about 200 mv. This allows differential input stage transistors Q11 and Q12 to accommodate common mode input signals that are much closer to the supply voltage V+ than was previously possible, or alternatively, allows the differential amplifier to operate at lower values of V+: as low as 1.2 volts ($V_{ce}$ of 200 mv+about 1 volt consumed by Q11/Q12 and $i_{diff}$).

The circuit configuration of FIG. 8 also enables the differential amplifier to operate with input signals that are referenced to the supply voltage V+. A connection 30 can be made between one of the differential amplifier inputs and V+, and signals that vary around V+ can be applied to the other input. If Q9's $V_{ce}$ is about 300 mv, the collector of Q11 will be 300 mv below V+. With the base of Q11 also at V+, $V_{cell}$ is equal to $V_{cell}$—300 mv. If $V_{bell}$ is about 600 mv, Q11 can still operate, even though its collector-base junction is slightly forward-biased.

The differential amplifier with low voltage differential to single-ended converter provides a relatively low impedance differential input, with a common mode voltage less than one $V_{be}$ down from V+; i.e., the collectors of Q11 and Q12 are largely isolated from the large voltage swings that can occur at the collector of Q10 in response to small changes in the differential input voltage $V_{in}$. Because a change in $i_1$ produces relatively small changes in their respective base voltages, the bases of Q8 and Q10 are fixed at a fairly signal-independent voltage. The collectors of Q11 and Q12 are connected to the emitters of Q10 and Q8, respectively, and Q8 and Q10 therefore serve to isolate the differential input stage from voltage swings at Q10's collector. This is desirable: because Q11's and Q12's collector voltages are constrained to be within the headroom described above, if too much of the output voltage swing is transmitted back to the collectors, Q11 and Q12 would cease to operate.

Figure 9:
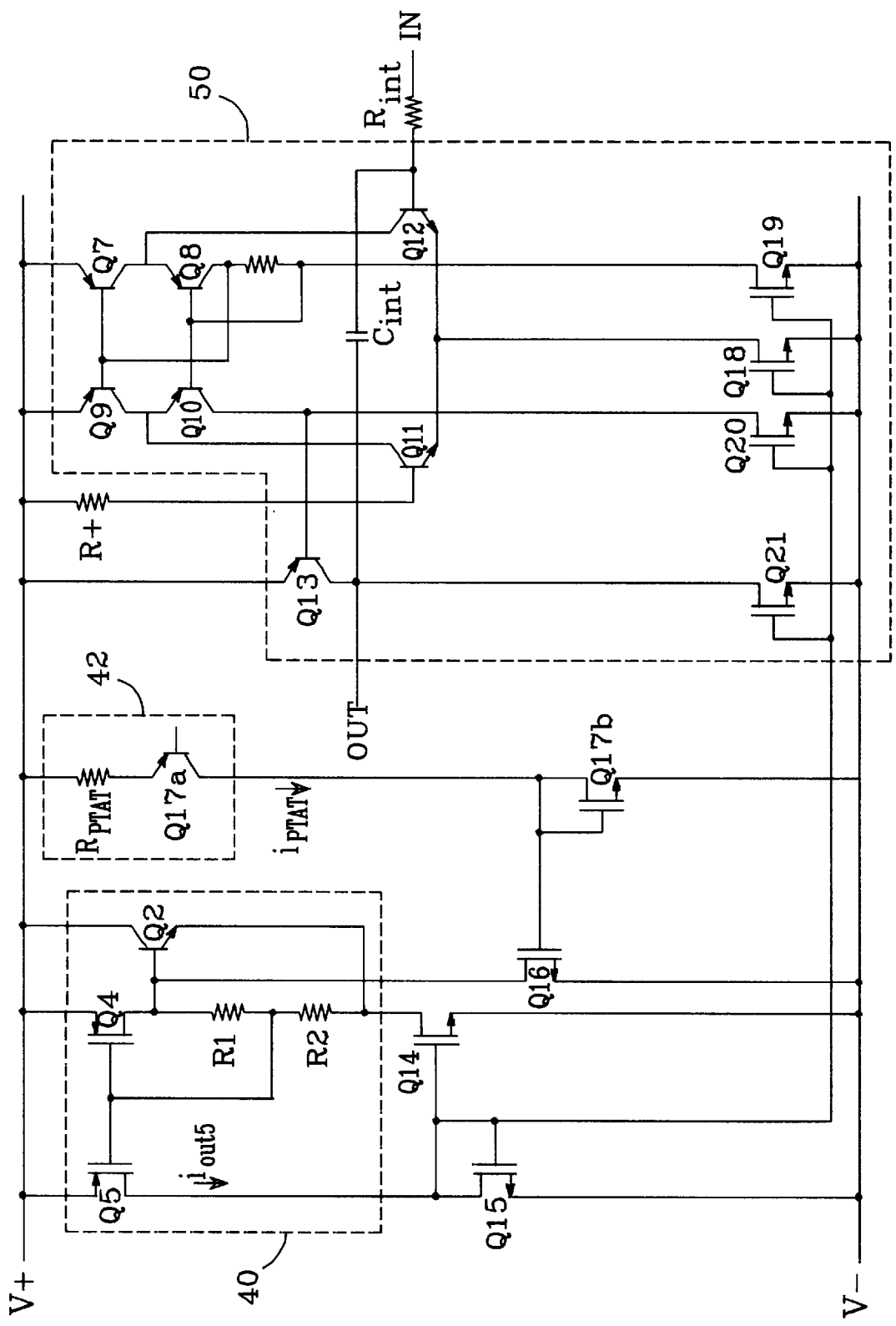
FIG. 9 is a schematic diagram of a low voltage integrator circuit employing a low voltage CTAT current source and differential amplifier per the present invention.

The low voltage CTAT current source and current mirror circuits are combined in the schematic diagram of FIG. 9, which implements a low voltage integrator circuit and also includes a novel technique for generating a temperature invariant current. A current source 40, configured as shown in FIG. 5a, generates an output current $i_{out5}$ at the drain of Q5. A transistor Q14 is in the place of FIG. 5a's poorly controlled current $i_{poor}$. A diode-connected transistor Q15 mirrors $i_{out5}$ to Q14, which cannot come on to "start" the current source, i.e., to cause Q4 to begin conducting, unless there is sufficient output current.

This problem is circumvented by using a transistor Q16 to start current source 40: Q16 has its drain connected to the drain of Q4 and its source connected to a supply voltage V−, which can include ground. A PTAT current source 42, such as a bandgap voltage reference circuit, typically has an output stage that includes a resistor $R_{PTAT}$ in series with a transistor Q17a which produces a PTAT current $i_{PTAT}$ at its collector. The PTAT current is connected to flow through a transistor Q17b, with Q16 connected to mirror the PTAT current through Q17b.

Current $i_{PTAT}$ comes up with the integrator circuit's supply voltages V+ and V−, and can thus be used to start current source 40: the mirrored $i_{PTAT}$ turns on Q16, which pulls on Q4's gate via R1. R1, R2 and the base of Q2 begin to go negative until Q4 turns on and supplies Q16's drain current—which will be PTAT in response to the PTAT signal on its gate. The current source comes on quickly, because as Q4 comes on, its output is reflected back, regeneratively, to its gate via R2. The current through Q4 is mirrored to Q5, and output $i_{out5}$ appears at Q5's collector. Now Q14 is turned on, with its current supplied by Q4 through resistors R1 and R2. Current through the resistors causes bipolar transistor Q2 to come on, and its $V_{be}$ across R1 and R2 make the current through the resistors CTAT.

The current through Q4 now includes the PTAT component from Q16, and the CTAT current from Q2 across R1 and R2. By selection of $R_{PTAT}$ in proper ratio with R1+R2, the PTAT and CTAT components can be made to sum up to a zero temperature coefficient current in Q4. That current is mirrored to Q5 to produce $i_{out5}$, which is mirrored by Q15 to Q14. Q14 thus operates at a temperature invariant current guaranteed to be larger than the current in R1 and R2, and the voltage on the gate of Q15 can be used to drive other transistors to create scalable temperature invariant currents.

The integrator circuit also includes a differential amplifier/differential to single-ended converter 50 as shown in FIG. 8 and described above. The current source $i_{diff}$ for the differential input stage (Q11, Q12) is implemented with a transistor Q18, having its drain connected to the pair's common emitters and its gate and source connected to mirror the temperature invariant output of current source 40. The base of input stage transistor Q11 is referenced to supply voltage V+ through a resistor R+. An integrator is created by connecting a resistor $R_{int}$ in series with the base of input stage transistor Q12, and a capacitor $C_{int}$ between the base of Q12 and the amplifier's output terminal OUT, taken at the collector of the amplifier's output transistor Q13. Transistors Q19 and Q20 serve as the converter's current sources $i_1$ and $i_2$, respectively, and transistor Q21 serves as the current source $i_3$ for the amplifier's output transistor Q13, with each connected to mirror the temperature invariant output of current source 40. An integrator is thus implemented which provides accurate performance over temperature while operating at reduced supply voltages.

Though a low voltage integrator is described above, the low voltage current source and current mirror disclosed herein find application in a wide array of analog circuits, and will provide benefits in many situations in which a low supply voltage renders conventional circuit configurations unusable or unreliable.

While particular embodiments of the invention have been shown and described, numerous variations and alternate embodiments will occur to those skilled in the art. Accordingly, it is intended that the invention be limited only in terms of the appended claims.

We claim:

1. A complementary-to-absolute temperature (CTAT) current source suitable for use with a low supply voltage, comprising:

a resistance circuit, a first transistor connected to establish a CTAT current through said resistance circuit, said first transistor being a bipolar transistor, a second transistor supplying said CTAT current to said resistance circuit, said resistance circuit biasing said second transistor to operate in its active region, and an output circuit producing an output current which represents said current supplied by said second transistor.

2. A complementary-to-absolute temperature (CTAT) current source suitable for use with a low supply voltage, comprising:

first and second resistances, one terminal of each resistance connected to a common node, a first bipolar transistor having its base and emitter connected to the terminals of said first and second resistances opposite said common node, respectively, a second transistor having a control input and a current circuit with first and second current terminals, the current through said current circuit varying with the voltage applied to said control input. said second transistor having its control input connected to said common node and its current circuit connected to a supply voltage and supplying current through said first and second resistances, and a third transistor connected to mirror the current supplied by said second transistor, said mirrored current being the output of said CTAT current source, said first bipolar transistor when turned on imposing its base-emitter voltage $V_{be}$ across said resistances thereby inducing a CTAT current through them, said resistances arranged to limit the voltage across said second transistor to a preselected fraction of said first transistor's $V_{be}$ sufficient to operate said second transistor in its active region.

3. The CTAT current source of claim 2, wherein said second and third transistors are FETs, said second transistor having a gate-to-source voltage $V_{gs}$ and a threshold voltage $V_t$, said current source output complying to within $V_{gs}$−$V_t$ of said supply voltage.

4. The CTAT current source of claim 3, wherein said resistances are arranged to impose a drain-source voltage across said second transistor that is less than its gate voltage minus its threshold voltage.

5. The CTAT current source of claim 3, wherein said second and third FET transistors have respective drains, each of which has a respective area, said third transistor mirroring the current through said second transistor with a ratio equal to the ratio of said third transistor's drain area to said second transistor's drain area.

6. The CTAT current source of claim 2, wherein said second and third transistors are bipolar, said second transistor having a minimum collector-to-emitter voltage $V_{ce}$(min.) at which it operates in its active region, said resistances arranged to impose $V_{ce}$(min.) across said second transistor such that said current source output complies to within $V_{ce}$(min.) of said supply voltage.

7. The CTAT current source of claim 6, wherein said resistances are arranged to impose a collector-emitter voltage across said second transistor that is less than its junction voltage.

8. The CTAT current source of claim 6, wherein said second and third bipolar transistors have respective emitters, each of which has a respective area, said third transistor mirroring the current through said second transistor with a ratio equal to the ratio of said third transistor's emitter area to said second transistor's emitter area.

9. The CTAT current source of claim 6, wherein the base-emitter voltage characteristics of said first and second transistors are about equal so that the collector-emitter voltage of said second transistor is about equal to the voltage across said second resistance.

10. The CTAT current source of claim 2, further comprising a current source connected to said first transistor's emitter to supply a current through said resistances, said current developing a voltage across said resistances sufficient to make said first bipolar transistor active.

11. The CTAT current source of claim 2, further comprising a cascode transistor having a control input and a current circuit with first and second current terminals, the current through said current circuit varying with the voltage applied to said control input, said cascode transistor connected to receive said mirrored current from said third transistor at said first current terminal and providing the output of said CTAT current source at said second current terminal, said cascode transistor increasing the impedance of said current source.

12. The CTAT current source of claim 11, wherein the control input of said cascode transistor is connected to the emitter of said first bipolar transistor.

13. The CTAT current source of claim 2, further comprising a fourth transistor having a control input and a current circuit with first and second current terminals, the current through said current circuit varying with the voltage applied to said control input, said fourth transistor's current circuit connected to the base of said first bipolar transistor, said fourth transistor arranged to mirror a proportional-to-absolute-temperature (PTAT) current and thereby cause a PTAT current to flow in said second transistor.

14. The CTAT current source of claim 13, further comprising a PTAT current source having an output which is mirrored by said fourth transistor, said PTAT current source and said first and second resistances arranged to produce CTAT and PTAT currents through said second transistor in a ratio whereby their respective temperature coefficients sum to nearly zero, said temperature invariant current mirrored by said third transistor to the output of said CTAT current source.

15. A complementary-to-absolute temperature (CTAT) current source, comprising:

a resistance, a first bipolar transistor having its base and emitter connected across said resistance, a second transistor having a control input and a current circuit with first and second current terminals, the current through said current circuit varying with the voltage applied to said control input, said second transistor having its control input connected to said first transistor's emitter and its current circuit connected to a supply voltage and supplying current through said resistance, and a third transistor connected to mirror the current supplied by said second transistor through said resistance, said mirrored current being the output of the current source, said first bipolar transistor when turned on imposing its base-emitter voltage $V_{be}$ across said resistance thereby creating a CTAT current through it.

16. A current mirror circuit suitable for use with a low supply voltage, comprising:

a resistance, top and bottom transistors connected in a cascode configuration and supplying current through said resistance, said transistors' control inputs connected to receive a voltage developed across said resistance in response to said current, said voltage biasing said top transistor to operate in its active region, and an output circuit producing an output current which represents said current supplied by said top and bottom transistors.

17. The current mirror circuit of claim 16, further comprising a programming current source connected to establish the current supplied through said resistance.

18. A current mirror circuit suitable for use with a low supply voltage, comprising:

a resistance having first and second terminals, first and second transistors connected in a cascode configuration between a first supply voltage and the first terminal of said resistance, said first and second transistors' control inputs connected to the first and second terminals of said resistance, respectively, a programming current source connected to supply a current through said resistance which develops a voltage across it, and third and fourth cascoded transistors having their bases connected to the respective bases of said first and second transistors and arranged to mirror the current through said first and second transistors, said fourth transistor providing said mirrored current as the output of said current mirror, said voltage across said resistance establishing a voltage across said first transistor sufficient to operate said first transistor in its active region.

19. The current mirror circuit of claim 18, wherein all of said transistors are bipolar and said resistance and programming current are arranged to establish a voltage across said first transistor which is less than its junction voltage.

20. The current mirror circuit of claim 18, wherein all of said transistors are FETs and said resistance and programming current are arranged to establish a voltage across said first transistor which is less than its gate voltage.

* * * * *